United States Patent
Abali et al.

(10) Patent No.: US 9,971,704 B2
(45) Date of Patent: May 15, 2018

(54) DATA COMPRESSION ACCELERATOR METHODS, APPARATUS AND DESIGN STRUCTURE WITH IMPROVED RESOURCE UTILIZATION

(71) Applicant: International Business Machines Corporation, Armonk, NY (US)

(72) Inventors: Bulent Abali, Tenafly, NJ (US); Bartholomew Blaner, Underhill Center, VT (US); Balaram Sinharoy, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 14/670,605

(22) Filed: Mar. 27, 2015

(65) Prior Publication Data

US 2016/0283398 A1    Sep. 29, 2016

(51) Int. Cl.
    *G06F 12/10*     (2016.01)
    *G06F 12/1018*   (2016.01)
    (Continued)

(52) U.S. Cl.
    CPC .......... *G06F 12/1018* (2013.01); *G06F 5/065* (2013.01); *H03M 7/3084* (2013.01);
    (Continued)

(58) Field of Classification Search
    CPC ..... G06F 12/00; G06F 12/0615; G06F 12/063
    (Continued)

(56) References Cited

U.S. PATENT DOCUMENTS 4,814,746 A * 3/1989 Miller ................. H03M 7/3088
                                                    341/95
5,951,623 A    9/1999 Reynar et al.
(Continued)

FOREIGN PATENT DOCUMENTS

WO    2016160354 A1    10/2016

OTHER PUBLICATIONS

International Search Report and Written Opinion dated Jun. 16, 2016 from International patent Application No. PCT/US16/22821 filed Mar. 17, 2016.

*Primary Examiner* — Tuan Thai
(74) *Attorney, Agent, or Firm* — Ryan, Mason & Lewis, LLP (57) ABSTRACT

Methods, apparatus and design structures are provided for improving resource utilization by data compression accelerators. An exemplary apparatus for compressing data comprises a plurality of hardware data compression accelerators and a hash table shared by the plurality of hardware data compression accelerators. Each of the plurality of hardware data compression accelerators optionally comprises a first-in-first-out buffer that stores one or more input phrases. The hash table optionally records a location in the first-in-first-out buffers where a previous instance of an input phrase is stored. The plurality of hardware data compression accelerators can simultaneously access the hash table. For example, the hash table optionally comprises a plurality of input ports for simultaneous access of the hash table by the plurality of hardware data compression accelerators. A design structure for a data compression accelerator system is also disclosed.

20 Claims, 5 Drawing Sheets

(51) Int. Cl.
  *H03M 7/30* (2006.01)
  *H03M 7/40* (2006.01)
  *G06F 5/06* (2006.01)
(52) U.S. Cl.
  CPC .......... *H03M 7/3086* (2013.01); *H03M 7/40* (2013.01); *H03M 7/6058* (2013.01); *G06F 2212/401* (2013.01)
(58) Field of Classification Search
  USPC .......................................... 711/100, 154, 216
  See application file for complete search history.

(56) References Cited

U.S. PATENT DOCUMENTS

| | | |
|---|---|---|
| 6,597,812 B1 | 7/2003 | Fallon et al. |
| 6,819,271 B2 | 11/2004 | Geiger et al. |
| 7,051,126 B1 | 5/2006 | Franklin |
| 7,307,552 B2 | 12/2007 | Ma et al. |
| 7,760,954 B2 | 7/2010 | Singh |
| 8,261,085 B1* | 9/2012 | Fernandez Gutierrez .............. G06F 21/565 711/113 |
| 8,515,965 B2 | 8/2013 | Mital et al. |
| 8,738,860 B1 | 5/2014 | Griffin et al. |
| 2010/0225506 A1* | 9/2010 | Chen .................... H03M 7/3086 341/51 |
| 2011/0154169 A1* | 6/2011 | Gopal .................. H03M 7/3084 714/807 |
| 2011/0307659 A1 | 12/2011 | Hans et al. |
| 2012/0257626 A1* | 10/2012 | McGhee .............. H04L 45/7453 370/392 |
| 2013/0159811 A1 | 6/2013 | Biran et al. |
| 2015/0006475 A1* | 1/2015 | Guo .................. G06F 17/30159 707/609 |
| 2015/0088837 A1* | 3/2015 | Nag .................. G06F 17/30312 707/692 |
| 2016/0149820 A1* | 5/2016 | McGhee ................ H04L 47/32 370/230 |

\* cited by examiner

DATA COMPRESSION ACCELERATOR METHODS, APPARATUS AND DESIGN STRUCTURE WITH IMPROVED RESOURCE UTILIZATION

FIELD OF THE INVENTION

Embodiments of the invention generally relate to data compression techniques, and, more particularly, to techniques for improving resource utilization by data compression accelerators.

BACKGROUND

Data compression involves encoding information using fewer bits than the original data stream. Lempel-Ziv (LZ) compression algorithms, for example, achieve compression by replacing repeated occurrences of data with references to a single copy of the data existing earlier in the original data stream.

Data compression accelerators are often implemented in hardware to provide improved compression throughput and/or reduced power consumption. In existing data compression accelerators, area and logic resource requirements dictate the number of accelerators that may be incorporated onto a single chip.

A need exists for improved resource utilization by data compression accelerators, for example, in terms of reduced area and logic blocks.

SUMMARY

In one aspect of the present invention, methods, apparatus and design structures are provided for improving resource utilization by data compression accelerators. An exemplary apparatus for compressing data comprises a plurality of hardware data compression accelerators and a hash table shared by the plurality of hardware data compression accelerators.

In one exemplary embodiment, each of the plurality of hardware data compression accelerators comprises a first-in-first-out buffer that stores one or more input phrases and the hash table records a location in a first-in-first-out buffer where a previous instance of an input phrase is stored. The hardware data compression accelerators comprise, for example, one or more of a hash function, a Lempel-Ziv (LZ) encoder and a Huffman encoder.

According to one exemplary aspect of the invention or elements thereof, the plurality of hardware data compression accelerators simultaneously access the hash table. For example, the hash table optionally comprises a plurality of input ports for simultaneous access of the hash table by the plurality of hardware data compression accelerators.

Another aspect of the invention or elements thereof is directed to a design structure for a data compression accelerator system. The design structure comprises a plurality of hardware data compression accelerators and a hash table shared by the plurality of hardware data compression accelerators.

These and other objects, features and advantages of the present invention will become apparent from the following detailed description of illustrative embodiments thereof, which is to be read in connection with the accompanying drawings.

DETAILED DESCRIPTION

Aspects of the present invention provide methods, apparatus and design structures that improve resource utilization by data compression accelerators, for example, in terms of reduced area and logic blocks. Aspects of the invention provide methods, apparatus and design structures in which multiple data compression accelerators share a single hash table thereby reducing resource utilization. According to one aspect of the invention, two or more independent data compression accelerators can simultaneously access a single shared hash table. An exemplary hash table memory buffer has multiple ports to allow for simultaneous access by multiple data compression accelerators.

Figure 1:
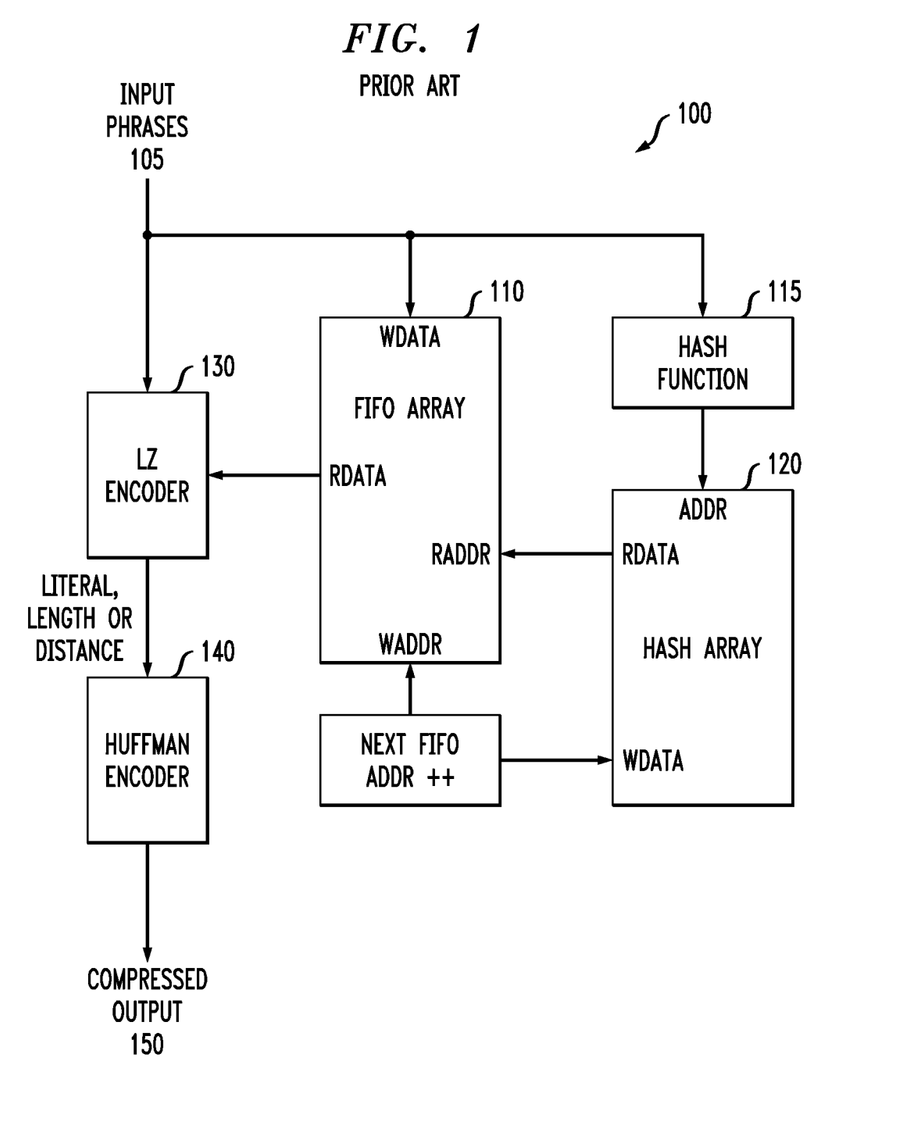
FIG. 1 illustrates an exemplary conventional data compression accelerator.

FIG. 1 illustrates an exemplary conventional data compression accelerator 100 comprising a first-in-first-out (FIFO) memory buffer 110 and a hash table 120. Data bytes, often referred to as input phrases 105, are entered sequentially into the FIFO 110. The hash table address of each phrase 105 is computed by a hash function 115 and the FIFO address is written to the hash table 120, in a known manner. The hash table 120 speeds up the phrase search process by indicating in one hash table read operation where in the FIFO 110 a previous instance of an input phrase 105 can be found. As discussed further below in conjunction with FIG. 2, duplicate instances of an input phrase 105 in the FIFO 110 are collapsed into a single instance, to thereby achieve data compression.

As noted above, LZ algorithms achieve compression by replacing repeated occurrences of data with references to a single copy of that data existing earlier in the uncompressed data stream. A match is encoded by an LZ encoder 130 as a pair of numbers often referred to as a length-distance pair. Huffman coding of the length-distance pair data is performed by a Huffman encoder 140, in a known manner.

Figure 2:
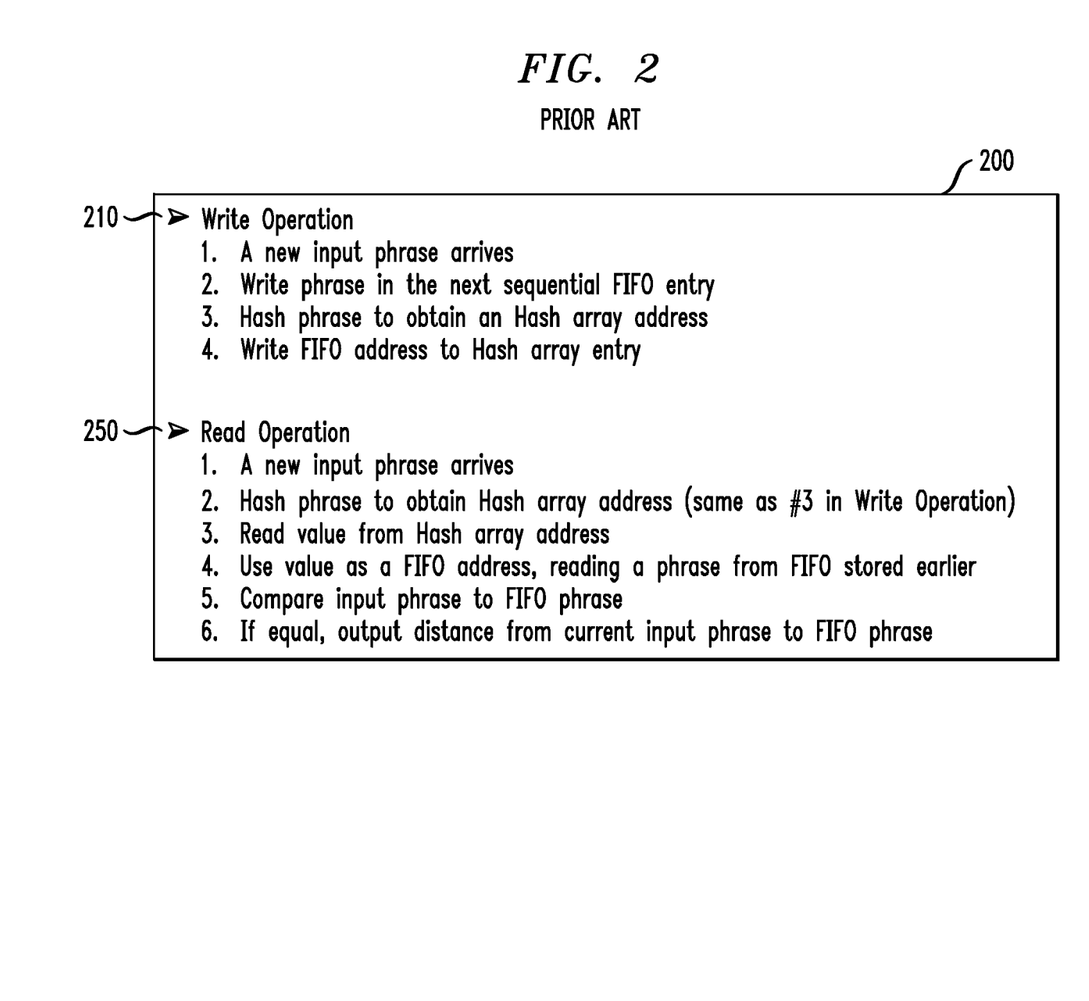
FIG. 2 is a flow chart illustrating an exemplary conventional compression process.

FIG. 2 is a flow chart illustrating an exemplary conventional compression process 200. Conventional compression processes 200 typically comprise a write operation 210, where an input phrase 105 is written to the next sequential entry in the FIFO 110 hash array address, and a read operation 250, where matches are detected and processed.

In particular, as shown in FIG. 2, during the exemplary write operation 210, a new input phrase is written in the next sequential entry of the FIFO 110 (steps 1 and 2), and the FIFO address is written to the hash array address computed by the hash function 115 (steps 3 and 4). In addition, during the exemplary read operation 250, the hash function 115 is applied to the input phrase 105 during step 2 to obtain a hash array address. A value is read from the indicated Hash array address during step 3, and the value is used as a FIFO address (raddr) during step 4, reading a phrase from the FIFO 110 stored earlier. The input phrase 105 is compared during step 5 to the phrase read from the FIFO during step 4. If the input phrase 105 and the read phrase are equal, then the distance from the current input phrase to the FIFO phrase is output during step 6.

It is noted that the same FIFO buffer 110 is typically used for data compression and decompression. For decompression, however, the hash table 120 is not required because the location in the FIFO array 110 of the input phrases 105 will be encoded in the compressed input stream. In existing compression accelerators 100, area and logic resource requirements dictate the number of accelerators that may be incorporated onto a single chip. As such, it is important to optimize the resource utilizations.

As noted above, aspects of the present invention provide methods and apparatus in which multiple data compression accelerators share a single hash table thereby reducing resource utilization, for example, in terms of reduced area and logic blocks. According to one aspect of the invention, two or more independent data compression accelerators can simultaneously access a Hash table, e.g., the hash table memory buffer has multiple ports allowing simultaneous access.

Figure 3:
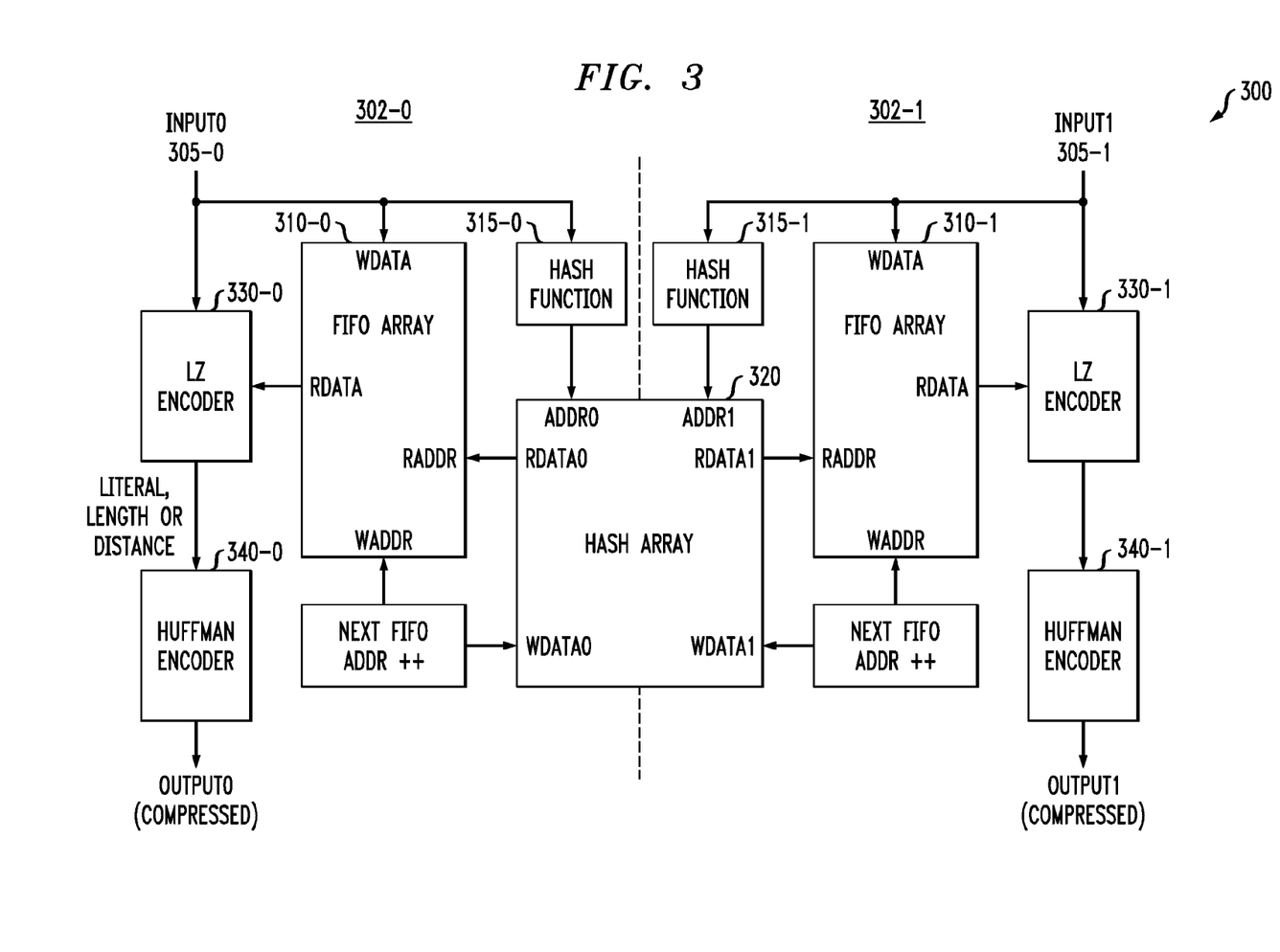
FIG. 3 illustrates an exemplary data compression accelerator system incorporating aspects of the invention.

FIG. 3 illustrates an exemplary data compression accelerator system 300 incorporating aspects of the invention. As shown in FIG. 3, the exemplary data compression accelerator system 300 comprises two data compression accelerators 302-0 and 302-1. Each data compression accelerator 302-0 and 302-1 processes respective input phrases 305-0 and 305-1 and comprises a FIFO memory buffer 310-0 or 310-1, LZ encoder 330-0 or 330-1 and Huffman encoder 340-0 or 340-1, that each operate in a similar manner as the corresponding elements in FIG. 1.

In the exemplary data compression accelerator system 300, the multiple data compression accelerators 302-0 and 302-1 share a single hash table 320, thereby reducing resource utilization, for example, in terms of reduced area and logic blocks. Exemplary embodiments of the hash table 320 are discussed further below in conjunction with FIGS. 4 and 5. The exemplary hash table 320 may be implemented, for example, as a Static Random Access Memory (SRAM).

In one or more embodiments, the two exemplary independent data compression accelerators 302-0 and 302-1 can simultaneously access the hash table 320. In one exemplary embodiment, the hash table 320 has multiple ports allowing simultaneous access by the two exemplary independent data compression accelerators 302-0 and 302-1. Each exemplary data compression accelerator 302-0 and 302-1 also comprises a corresponding hash function 315-0 or 315-1.

Figure 4:
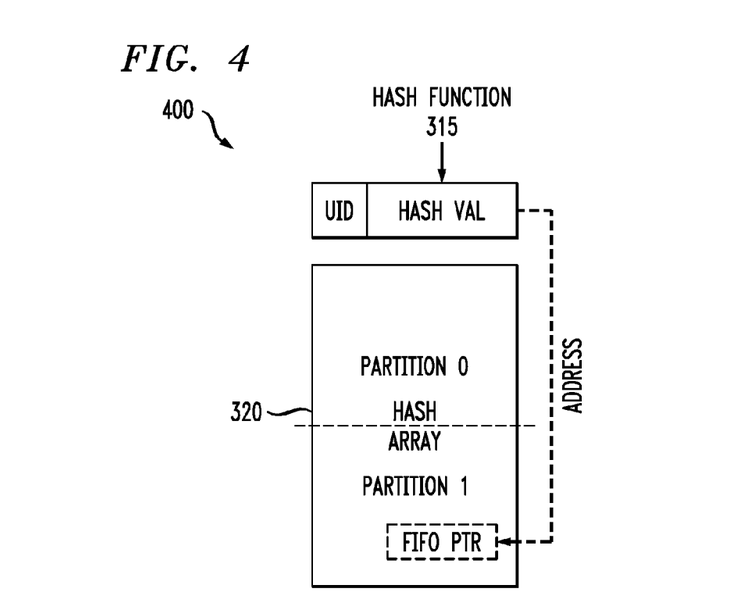
FIGS. 4 and 5 illustrate exemplary alternative embodiments of the hash table of FIG. 3.

FIG. 4 illustrates a first exemplary embodiment 400 of the hash table 320. In the exemplary embodiment 400 of FIG. 4, the hash table 320 is statically partitioned, for example, into two half size logical arrays, each privately owned by one accelerator 302-0 or 302-1, so that the two accelerators 302-0 and 302-1 can compress data at the same time. In the exemplary embodiment of FIG. 4, the hash table 320 is statically partitioned into two equal size logical arrays. As shown in FIG. 4, the Unit ID (UID) bit is concatenated with the hash value generated by the hash function 315. The UID bit is used to select the hash array entry in the partition associated with the proper accelerator 302-0 or 302-1.

In one variation of the embodiment shown in FIG. 4, the partition is not static but rather, is performed dynamically on a per compression operation basis. If two compression operations are to be performed at approximately the same time, the hash table 320 is dynamically partitioned into two logical portions (e.g., halves). If the partition is not acceptable, then one of the accelerators 302-0, or 302-1, waits until it gets exclusive access to the entire hash table 320 after which the second accelerator 302 waits.

Figure 5:
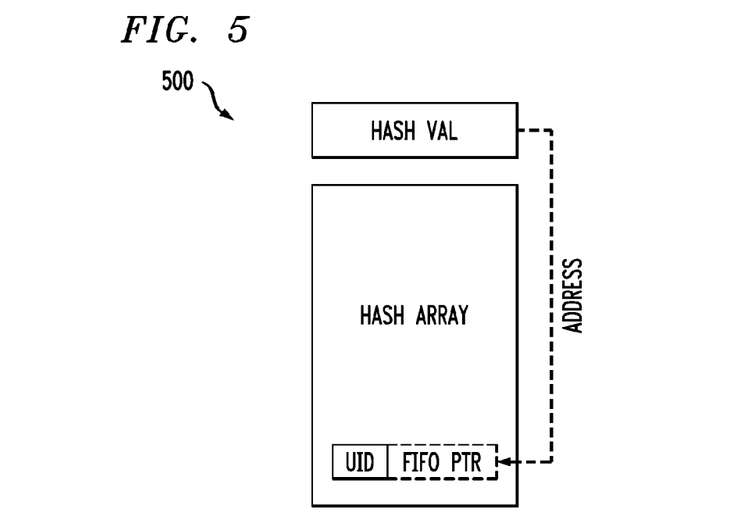

FIG. 5 illustrates another exemplary embodiment 500 of the hash table 320. In the exemplary embodiment 500 of FIG. 5, the hash table 320 is not partitioned into two arrays. Rather, the stored hash table entries from both accelerators are intermixed in the hash table 320. Each entry in the hash table 320 comprising a FIFO pointer is tagged with the accelerator identification number (a Unit ID or UID) at the time of the write. For example, if accelerator 302-0 writes an entry in the hash table 320, the entry is tagged with a UID=0. When an accelerator 302 recalls an input phrase from the hash table 320, the ID of the accelerator 302 will be checked against the stored UID to ensure that the entry belongs to the correct accelerator 302. Thus, the exemplary embodiment of FIG. 5 allows accelerators to share the Hash table capacity dynamically without a static partition.

In this manner, the UID bit in the hash array entry identifies the accelerator 302-0 or 302-1 that the entry belongs to.

Balancing Resource Utilization, Compression Ratio and Speed

A hash table partitioned into smaller pieces, such as half the size of the non-partitioned hash table, will generally yield a slightly worse compression ratio than the non-partitioned hash table. In a hash table-based design, the most recently entered input phrases will overwrite the older phrases. Thus, the accelerator "forgets" the older entries and the likelihood of achieving compression is reduced. Thus, in the disclosed partitioned design, there is a tradeoff between the resource utilization, the compression ratio, and speed. These tradeoffs may be acceptable depending on the usage scenario of the data compression accelerators. For example, many data storage operations are mostly read operations with fewer write operations. Thus, decompression operations will be more frequent than compression operations, thereby making the likelihood of two compression operations occurring at the same time a rare event.

If a high compression ratio is needed, then only one compression accelerator 302 may be allowed at any given moment therefore preventing the partition. If speed is needed, both compression accelerators 302-0 and 302-1 may be active at the same time, thereby giving up compression performance in favor of speed.

The partitioned embodiment 400 of FIG. 4 requires the logic to explicitly divide the hash table 320 into partitions at least on a per compression operation basis, while the embodiment 500 of FIG. 5 achieves the objective dynamically. If only one compression operation is active at any given time, then the entire capacity of hash table 320 is utilized. If two operations are active at the same time, the capacity of the hash table 320 is shared dynamically, as needed. Continuing with the previous storage example, the likelihood of two compression operations occurring at the same time will be rare. Thus, the hash table 320 will be generally be used exclusively by a single compression operation at a given time.

The following table illustrates the resource requirements of exemplary embodiments of the present invention. As shown in the following table, the exemplary hash table 320 uses 39% of the resources in a conventional single accelerator unit implementation, such as that shown in FIG. 1. If two accelerators are used in accordance with aspects of the present invention, the necessary resource requirements drop from 200% to 161% as a result of the shared hash table 320.

|  | 1 Unit | 2 Units |
| --- | --- | --- |
| FIFO | 10 | 20 |
| HASH | 39 | 39 |

|  | 1 Unit | 2 Units |
|---|---|---|
| LOGIC | 17 | 34 |
| HUFFM | 34 | 69 |
| TOTAL | 100 | 161 |

Conclusion

Among other benefits, the exemplary data compression accelerator system 300 improves resource utilization by data compression accelerators. The exemplary data compression accelerator system 300 comprises a plurality of data compression accelerators that share a single hash table to thereby reduce resource utilization.

The resulting integrated circuit (IC) chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from low-end compressions applications to advanced computer products having a display, a keyboard or other input device, and a central processor.

Figure 6:
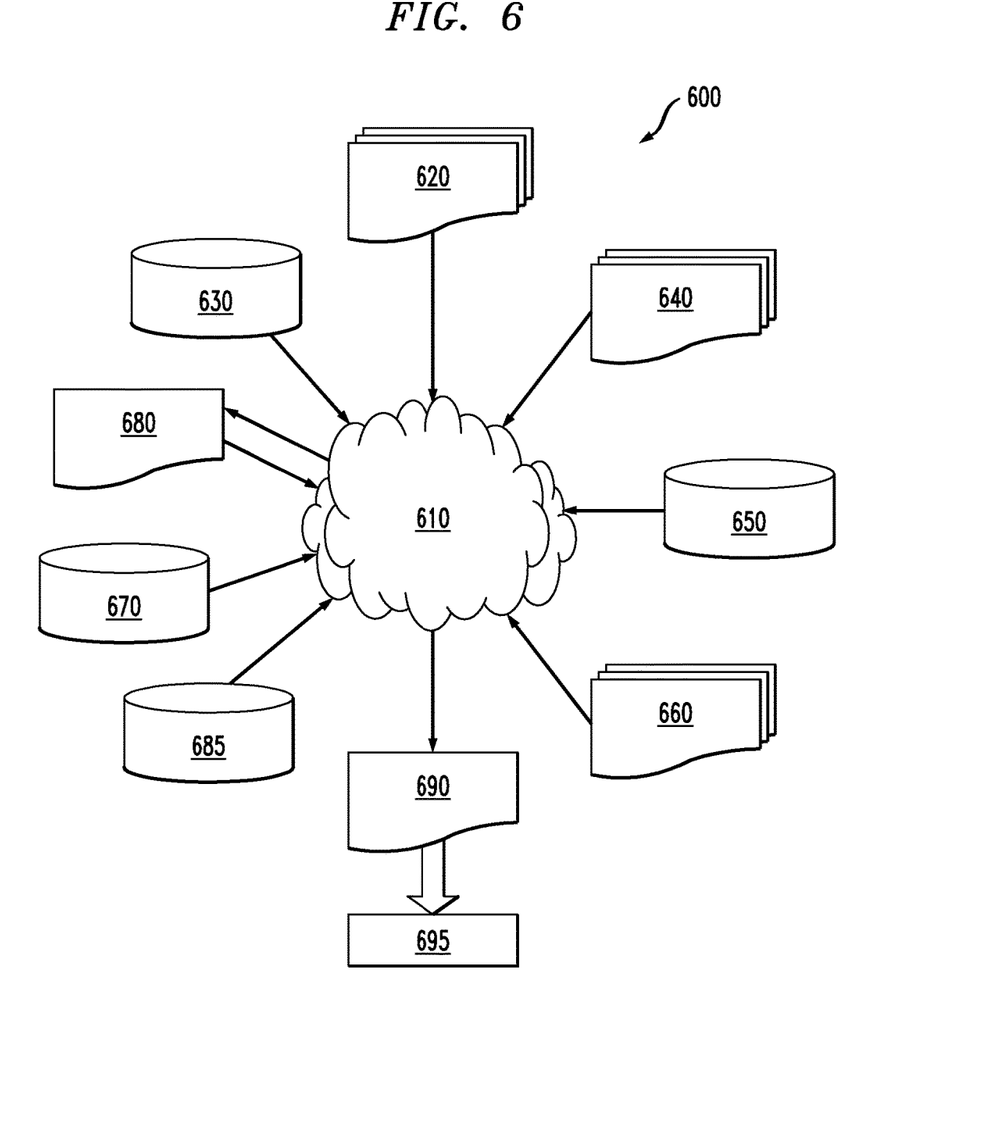
FIG. 6 is a flow diagram of a design process used in semiconductor design, manufacture, and/or test.

FIG. 6 shows a block diagram of an exemplary design flow 600 used for example, in semiconductor IC logic design, simulation, test, layout, and manufacture. Design flow 600 includes processes, machines and/or mechanisms for processing design structures or devices to generate logically or otherwise functionally equivalent representations of the design structures and/or devices described above and shown in FIG. 3. The design structures processed and/or generated by design flow 600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission, gate array, or storage medium, design structure 620 may be accessed and processed by one or more hardware and/or software modules within design process 610 to simulate or otherwise functionally represent an electronic component, circuit, electronic or logic module, apparatus, device, or system such as those shown in FIG. 3. As such, design structure 620 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIG. 3 to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design.

Netlist 680 may be synthesized using an iterative process in which Netlist 680 is resynthesized one or more times depending on design specifications and parameters for the device. As with other design structure types described herein, Netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other suitable networking means.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685, which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures along with any additional mechanical design or data (if applicable), to generate a second design structure 690. Design structure 690 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 3. In one embodiment, design structure 690 may comprise a compiled, executable HDL simulation model that functionally simulates the devices shown in FIG. 3.

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 3. Design structure 690 may then proceed to a stage 695 where, for example, design structure 690: proceeds to tape-out, is released to manufacturing, is released to a mask house, is sent to another design house, is sent back to the customer, etc.

As will be appreciated by one skilled in the art, aspects of the present invention may be embodied as a system, method and/or design structure.

Aspects of the present invention are described herein with reference to flowchart illustrations and/or block diagrams of methods, apparatus (systems), and design structures according to embodiments of the invention. The flowchart and block diagrams in the Figures illustrate the architecture, functionality, and operation of possible implementations of systems, methods, and design structures according to various embodiments of the present invention. It is noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In any case, it should be understood that the components illustrated herein may be implemented in various forms of hardware, software, or combinations thereof, for example, application specific integrated circuit(s) (ASICS), functional circuitry, an appropriately programmed general purpose digital computer with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of another feature, integer, step, operation, element, component, and/or group thereof.

The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus for compressing data, comprising:
a plurality of hardware data compression accelerators that each process a respective stream of input phrases of said data during one or more of a write operation and a read operation of said data; and
a hash table shared by said plurality of hardware data compression accelerators during said one or more of said write operation and said read operation of said data, wherein said shared hash table records a location where a previous instance of a given input phrase of said data from said respective stream of input phrases of said data is stored and wherein multiple instances of said given input phrase are stored in said shared hash table as a single instance of said given input phrase to compress said data, wherein at least two of said plurality of hardware data compression accelerators substantially simultaneously share access to said shared hash table.

2. The apparatus of claim 1, wherein said hash table records said location in a first-in-first-out buffer where most recently entered input phrases will overwrite the older phrases.

3. The apparatus of claim 1, wherein each of said plurality of hardware data compression accelerators comprise a first-in-first-out buffer that stores one or more input phrases.

4. The apparatus of claim 1, wherein each of said plurality of hardware data compression accelerators comprise one or more of a hash function, a Lempel-Ziv (LZ) encoder and a Huffman encoder.

5. The apparatus of claim 1, wherein said plurality of hardware data compression accelerators simultaneously access said hash table.

6. The apparatus of claim 1, wherein said hash table comprises a plurality of input ports for simultaneous access of said hash table by said plurality of hardware data compression accelerators.

7. The apparatus of claim 1, wherein said hash table is partitioned into a plurality of logical arrays.

8. The apparatus of claim 7, wherein said partitioning of said hash table is performed dynamically for each compression operation.

9. The apparatus of claim 1, wherein values stored in said hash table have an associated identifier to indicate a corresponding one of said plurality of hardware data compression accelerators.

10. The apparatus of claim 1, wherein said apparatus is embodied on an integrated circuit.

11. A hardware description language (HDL) design structure encoded on a non-transitory machine-readable data storage medium, said HDL design structure comprising elements that when processed in a computer-aided design system generates a machine-executable representation of a data compression accelerator system, wherein said HDL design structure comprises:

a plurality of hardware data compression accelerators that each process a respective stream of input phrases of said data during one or more of a write operation and a read operation of said data; and a hash table shared by said plurality of hardware data compression accelerators during said one or more of said write operation and said read operation of said data, wherein said shared hash table records a location where a previous instance of a given input phrase of said data from said respective stream of input phrases of said data is stored and wherein multiple instances of said given input phrase are stored in said shared hash table as a single instance of said given input phrase to compress said data, wherein at least two of said plurality of hardware data compression accelerators substantially simultaneously share access to said shared hash table.

12. The HDL design structure of claim 11, wherein said hash table records said location in a first-in-first-out buffer where most recently entered input phrases will overwrite the older phrases.

13. The HDL design structure of claim 11, wherein each of said plurality of hardware data compression accelerators comprise a first-in-first-out buffer that stores one or more input phrases.

14. The HDL design structure of claim 11, wherein each of said plurality of hardware data compression accelerators comprise one or more of a hash function, a Lempel-Ziv (LZ) encoder and a Huffman encoder.

15. The HDL design structure of claim 11, wherein said plurality of hardware data compression accelerators simultaneously access said hash table.

16. The HDL design structure of claim 11, wherein said hash table comprises a plurality of input ports for simultaneous access of said hash table by said plurality of hardware data compression accelerators.

17. The HDL design structure of claim 11, wherein said hash table is partitioned into a plurality of logical arrays.

18. The HDL design structure of claim 17, wherein said partitioning of said hash table is performed dynamically for each compression operation.

19. The HDL design structure of claim 11, wherein values stored in said hash table have an associated identifier to indicate a corresponding one of said plurality of hardware data compression accelerators.

20. The HDL design structure of claim 11, wherein said plurality of hardware data compression accelerators and said hash table are embodied on an integrated circuit.

* * * * *